United States Patent [19]
Partin et al.

[11] Patent Number: 4,747,108
[45] Date of Patent: May 24, 1988

[54] LEAD-EUROPIUM-SELENIDE-TELLURIDE DIODE LASER

[75] Inventors: Dale L. Partin, Sterling Heights; Joseph P. Heremans, Troy, both of Mich.

[73] Assignee: General Motors Corporation, Detroit, Mich.

[21] Appl. No.: 879,881

[22] Filed: Jun. 30, 1986

[51] Int. Cl.$^4$ ............................................. H01S 3/19
[52] U.S. Cl. ........................................ 372/44; 357/16; 357/17; 357/61; 372/45
[58] Field of Search ............... 372/44, 45, 46; 357/16, 357/17, 61

[56] References Cited

U.S. PATENT DOCUMENTS

| 4,350,990 | 9/1982 | Lo | 357/16 |
| 4,608,694 | 8/1986 | Partin | 372/44 |
| 4,612,644 | 9/1986 | Partin | 372/44 |

OTHER PUBLICATIONS

D. L. Partin, "Lead–Europium–Selenide–Telluride Grown by Molecular Beam Epitaxy," Journal of Electronic Materials, v 13, n 3 (May 1984).

*Primary Examiner*—James W. Davie
*Attorney, Agent, or Firm*—Robert J. Wallace

[57] ABSTRACT

A double heterojunction lead salt semiconductor diode laser having an optical cavity of PbEuSeTe alloy with a quantum well having reduced Eu concentration disposed to one side of the optical cavity, the optical cavity having a given lattice constant and index of refraction. The optical cavity is sandwiched between two PbEuSeTe alloy confinement layers that are mutually of opposite conductivity type and have substantially the same lattice constant as the optical cavity. A pn junction surface in the optical cavity and preferably on or adjacent the quantum well layer injects charge carriers into the optical cavity. The larger energy band gap between the quantum well layer and its adjacent sandwiching confinement layer strongly confines charge carriers of one type from recombining in the oppositely doped adjacent sandwiching layer. This results in a decreased threshold current ($I_{th}$) and a higher maximum operating temperature.

19 Claims, 4 Drawing Sheets

U.S. Patent  May 24, 1988  Sheet 1 of 4  4,747,108
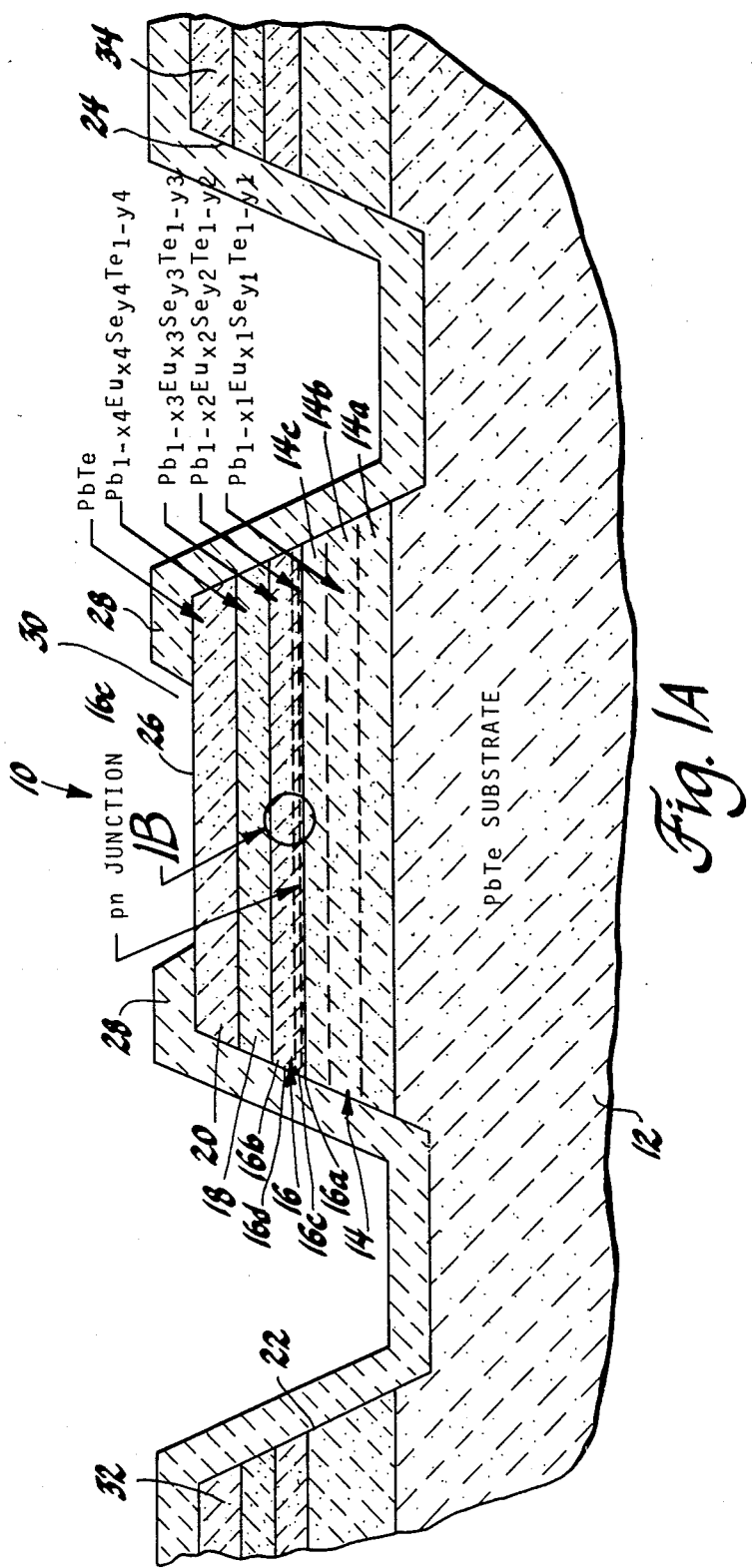
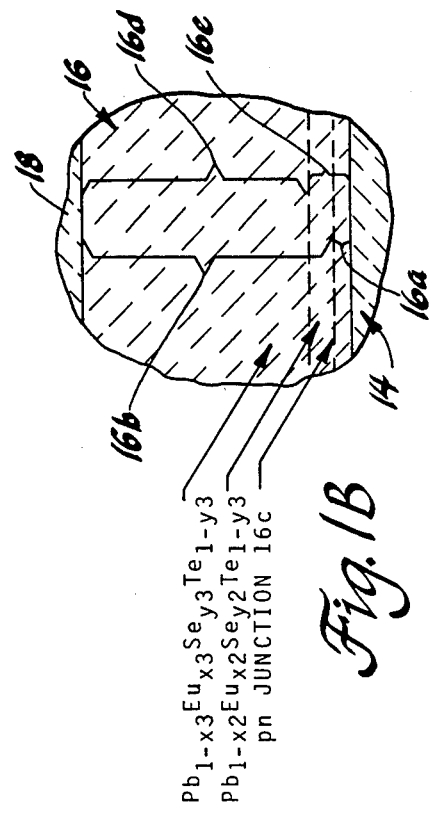

LEAD-EUROPIUM-SELENIDE-TELLURIDE DIODE LASER

FILED OF THE INVENTION

This invention relates to semiconductor diode lasers, and more particularly to diode lasers having a lead chalcogenide optical cavity containing a single quantum well, the optical cavity being sandwiched between two lead chalcogenide layers that contain europium, selenium, and tellurium and the quantum well layer being adjacent one of the two lead chalogenide layers. In addition, the two lead chalcogenide layers are lattice matched to the optical cavity and have higher band gap energies than the optical cavity.

BACKGROUND OF THE INVENTION

A semiconductor diode laser is a monocrystalline pn junction device. In one form of such a device, the pn junction is in a plane disposed in an active region between two parallel rectangular faces of a monocrystalline semiconductor body. Two mutually parallel reflective faces that are perpendicular to the pn junction form a laser cavity. Laser action is produced by applying a forward bias voltage across the pn junction. The forward bias injects electrons and holes across the pn junction. These electrons and holes recombine in the active region and give rise to stimulated emission of radiation in the form of photons. Above a given level of electron injection, called the threshold current ($I_{th}$), emitted radiation is collected and amplified in the active region. The amplified radiation exits the active region parallel the pn junction as a monochromatic beam.

The threshold current, $I_{th}$, is an increasing function of operating temperature, so that, as temperature increases, more charge carriers must be injected across the pn junction to cause laser action. Thus, to create semiconductor diode lasers that operate at higher temperatures, the threshold current must be reduced and/or the charge carriers must be injected into the active region more efficiently.

One problem in reducing threshold current is that electrons and holes can be injected into the active region without resulting in stimulated emission therein. For example, they can escape outside the active region to adjacent portions of the semiconductor body, where they recombine without contributing to laser emission. Even assuming that the stimulated emission takes place, the photons produced in the active region can escape from the active region by radiation in a direction that is not parallel to the pn junction. In addition, it is possible for electrons to disappear within the active region without producing the desired emission of radiation, such as by combining with holes at crystal defects. All such losses increase the threshold current.

The design of a semiconductor diode laser can be changed to resist the escape of injected electrons ano holes and stimulated photons from the active region by sandwiching the active region between two contiguous layers of monocrystalline semiconductive material having a larger energy band gap and a lower index of refraction than the active region. The active region thus becomes an optical cavity. The difference in energy band gaps retains the charge carriers while the changed index of refraction confines the photons in the optical cavity. The optical cavity, and as a practical matter, the two contiguous layers must be of a very high monocrystalline quality. This requires that these layers and the active region be closely matched not only in crystal structure but also in crystal lattice size. Moreover, one of the sandwiching layers must be doped to n-type conductivity and the other to p-type conductivity. Such a structure is referred to herein as a double heterojunction semiconductor diode laser.

The efficiency of injecting charge carriers (electrons, for example) into the optical cavity is reduced by the escape of sufficiently energetic such carriers from the optical cavity to the sandwiching layer doped to have a conductivity type opposite to the carrier type. It is therefore desirable to create a double heterojunction semiconductor diode laser with increased injection current efficiency by reducing electron leakage current into the p-type side of the pn junction or pull leakage current into the p-type side of the pn junction.

SUMMARY OF THE INVENTION

The present invention is a double heterojunction semiconductor diode laser with an increased operating temperature. This semiconductor diode laser comprises a first confinement layer of a semiconductor material having the formula $Pb_{1-x1}Eu_{x1}Se_{y1}Te_{1-y1}$; an optical cavity having two surfaces comprising (a) a quantum well layer of a semiconductor material having the formula $Pb_{1-x2}Eu_{x2}Se_{y2}Te_{1-y2}$ ($x1>2$) and one of the two surfaces being adjacent the first confinement layer, the quantum well layer's thickness being approximately equal to the deBroglie wavelength of charge carriers in the quantum well, and (b) a waveguide layer of semiconductor material having the formula $Pb_{1-x3}Eu_{x3}Se_{y3}Te_{1-y3}$ ($x2<x3<x1$); a second confinement layer of semiconductor material having the formula $Pb_{1-x4}Eu_{x4}Se_{y4}Te_{1-y4}$ ($x4>x3$), the second confinement layer being adjacent the other of the two optical cavity surfaces; and a pn junction surface defining two conductivity-type regions in the laser. Semiconductor material in one conductivity-type region is doped p-type and the semiconductor material in the other region is doped n-type.

In one embodiment, the double heterojunction semiconductor diode laser is formed with the first confinement layer being grown on a substrate. The quantum well layer is adjacent the first confinement layer, has a thickness in the range of 200–1200 angstroms, and has a composition in which x2 is less than 0.025. The pn junction surface lies within or adjacent the quantum well layer and the conductivity type of the semiconductor material in the conductivity region containing the first confinement layer is p-type.

In other embodiments, the second confinement layer can be grown on the substrate material.

BRIEF DESCRIPTION OF THE DRAWING

FIGS. 1A and 1B show a fragmentary sectional view of a lead salt semiconductor diode laser made from the quaternary PbEuSeTe system.

DESCRIPTION OF A PREFERRED EMBODIMENT

Figure 2A:
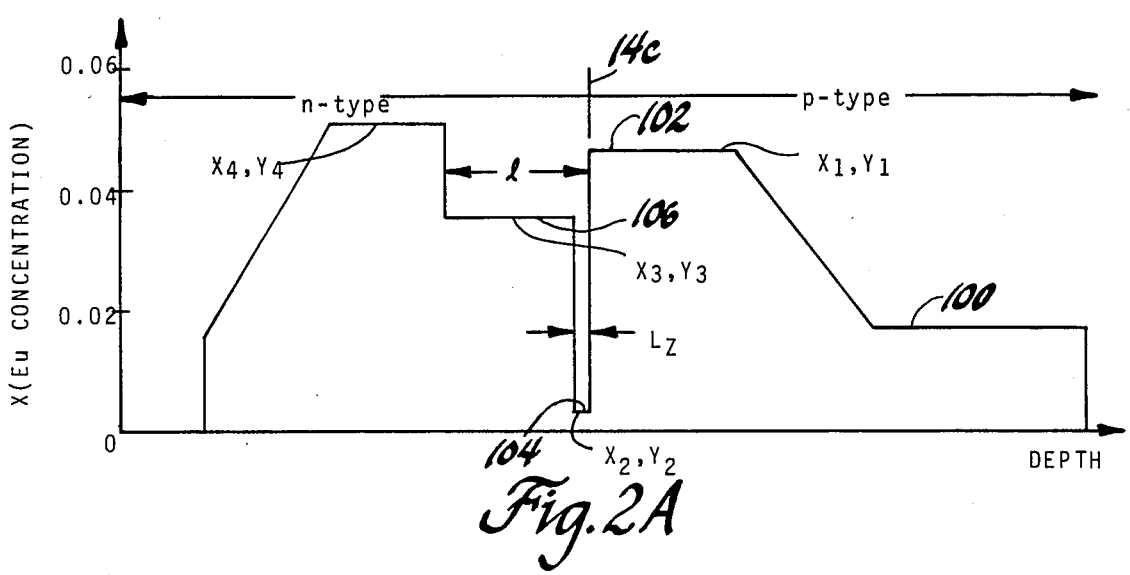
FIGS. 2A, 2B, 2C; 3A, 3B, 3C; and 4A, 4B, 4C are graphs illustrating various compositions of a semiconductor diode laser made from the quaternary PbEuSeTe system.

This invention recognizes that increased carrier injection in a lead-europium selenium-tellurium semiconductor diode laser results from the incorporation of a quantum well at one side of the laser's active region. The quantum well can be created in a semiconductor diode laser having an active region which is also a large optical cavity. By proper control of the constituents in this quaternary alloy system, a diode laser having a single crystal structure and a uniform lattice constant can be created. Lasers of this type have been disclosed in a U.S. patent application Ser. No. 565,397, now U.S. Pat. No. 4,608,694, by Dale L. Partin, U.S. Pat. No. 4,608,694, which is assigned to the assignee of the present patent application and which is herein incorporated by reference.

FIG. 1A illustrates a semiconductor diode laser element 10 made on a 0.5 millimeter thick monocrystalline lead telluride (PbTe) substrate 12. Substrate 12 has a (100) orientation and a p-type doping of about $2 \times 10^{19}$ atoms per cubic centimeter. As is normal for such compositions, the crystal structure is face centered cubic and the lattice constant is about 6.460 angstroms. The drawing shows a fragment of substrate 12 in section across mesas of its surface. The fragment shown includes an entire mesa in a central portion and portions of mesas 32 and 34 on each side of the central mesa. The central mesa contains a laser cavity, and is as hereinafter described. As is usual, side mesas 32 and 34 are only present because they are incidentally formed in the laser element maufacturing process. Thus, they are no more important to this invention than they are to any other semiconductor diode laser structure.

The structure in the drawing is made by epitaxially depositing a blanket semiconductive layer 14 of $Pb_{0.980}Eu_{0.020}Se_{0.023}Te_{0.977}$ alloy onto the lead telluride substrate 12. This is designated by the flat segment 100 of the europium concentration curves of FIGS. 2A, 3A, and 4A. It can be seen that semiconductive lead salt layer 14 differs from the lead salt substrate 12 in that it also contains both europium and selenium. Even though semiconductive layer 14 contains 2.0 mole percent europium and 2.3 mole percent selenium, it is still monocrystalline and has a face centered cubic crystal structure with a lattice constant of about 6.460 angstroms. In addition, it is of p-type conductivity, having a heavy p-type dopant concentration in the range of approximately $5 \times 10^{18}$ to $2 \times 10^{19}$ atoms per cubic centimeter, a range of dopant concentrations that makes this layer more highly conductive. Thus, the interface between confinement layer 14 and substrate 12 presents no significant electrical resistance. The europium and selenium-containing lead chalcogenide layer 14 is most importantly an electron, hole and photon confinement layer for the optical cavity (active layer) 16 that is over it. As such, it should be at least about 1–2 micrometers thick. However, confinement layer 14 also serves as a buffer layer for optical cavity 16. To serve the latter purpose as well, confinement layer 14 is grown to a thickness of about 5 micrometers. By buffer layer we mean that confinement layer 14 is grown to a sufficient thickness to at least partially mask crystal imperfections that may arise at its interface with the substrate 12. Such a thickness and purpose is not new, nor more critical to this invention than any other lead salt laser. In any event, a thickness of about 3 micrometers is generally needed to perform the buffering function. Generally, there is not much improvement in the buffering function with thickness above 6 micrometers. In this additional thickness, the europium concentration is increased to approximately 5 molar percent, with the selenium concentration also varying in order to maintain the crystal structure and having a uniform lattice constant. This feature is shown as europium concentration plateau 102 in FIGS. 2A, 3A, and 4A.

Optical cavity 16, in FIG. 1B, which is monocrystalline and of a face centered cubic crystal structure having a lattice constant of about 6.460 angstroms, contains the pn junction surface 16c across which charge carriers are injected by the application of a forward bias voltage. Therefore, region 16a is doped to p-type conductivity, having a p-type impurity concentration of about $1 \times 10^{17}$ to $2 \times 10^{18}$ atoms per cubic centimeter. Upper portion 16b of layer 16 is doped to n-type conductivity, having an n-type impurity concentration of about $1 \times 10^{17}$ to $2 \times 10^{18}$ atoms per cubic centimeter. These dopant levels have been found to produce the most intense light. The location of pn junction surface 16c can be varied within the thickness of optical cavity 16, but it will preferably appear adjacent either face of optical cavity 16, or slightly displaced from either face, as will be described below, within or adjacent quantum well layer 16e. The dopant level within quantum well layer 16e itself is preferably lightly doped in the range of $1 \times 10^{17}$ to $3 \times 10^{17}$ per cubic centimeter. In practice, these dopant levels can be achieved through diffusion of n-type or p-type dopants from layers 16d or 14c, respectively, or the existence of vacancies in the lead sublattice in the quantum well layer 16e.

Optical cavity 16 contains two fundamentally different quaternary (i.e., PbEuSeTe) material layers: a quantum well layer 16e disposed toward one side of the thickness of optical cavity 16 and a substantially uniform waveguide layer which forms the remainder of optical cavity 16. Various spatial relationships among pn junction 16c, the quantum well layer 16e, and the wave guide layer portion of the optical cavity 16 are possible in accordance with the present invention.

Figure 3A:
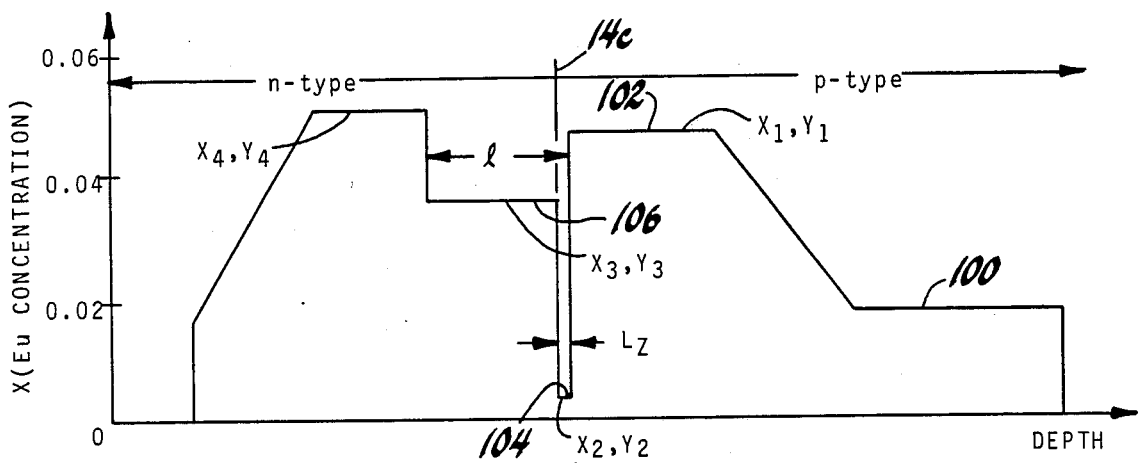
Figure 3B:
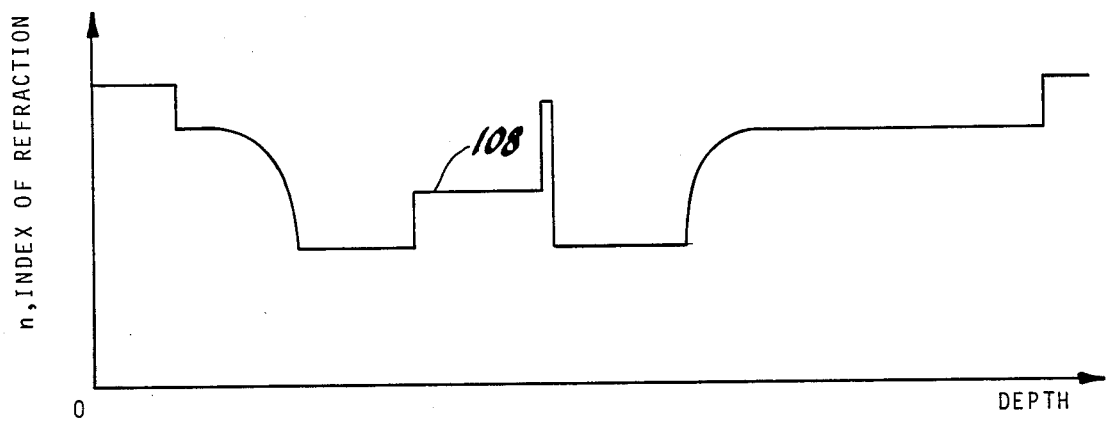
Figure 3C:
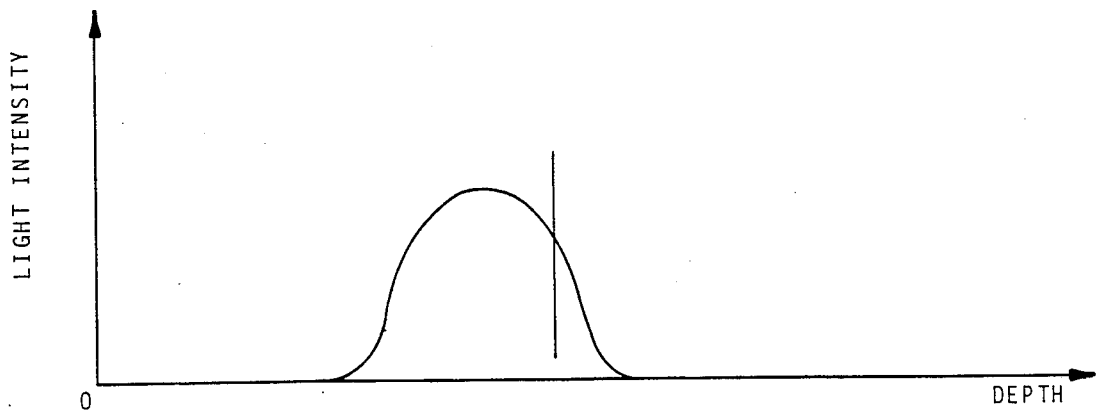

As seen in FIG. 2A, the europium concentration 104, which creates quantum well 16e, can be formed immediately adjacent europium concentration plateau 102 of buffer layer 14 and pn junction 16c can also be formed at the heterojunction between quantum well layer 16e and buffer layer 14. The thickness of quantum well layer 16e, $L_z$, is between 200 and 1200 angstroms and the europium concentration, $x_2$, in this layer is between 0 and approximately 2.5 molar percent. The quantum well thickness is determined by the deBroglie wavelength of the carriers, $\lambda = h/p$, where h is Planck's constant and p is the carrier momentum. In a lead-europium selenium-telluride alloy material, the deBroglie wavelengths of holes and electrons are within 10 percent of each other. In a quantum well of this thickness, the energy levels of the carriers are quantized according to the bound-state energies of a finite square well. A narrower quantum well has fewer quantized energy levels, and those quantized levels that exist are further removed from the lowest energy levels attainable in very wide quantum wells. Therefore, a narrower quantum well can produce shorter wavelength light. On the other hand, because of increased leakage current, the maximum operating temperature of a quantum well laser decreases when the quantum well width is decreased below a known dimension. Increasing the quantum well width diminishes the available quantum effects and reduces the photons produced at the desired lasing energy. We have discovered that the maximum operating temperature occurs when the quantum well width falls in the range of 500–1000 angstroms.

It is known that the confinement of electrons to the quantum well layer can be increased by increasing the europium concentration in the adjacent PbEuSeTe layers (16d and 14c), thereby increasing the conduction band edge energy ($E_c$). The confinement of holes to said quantum well layer is also thereby increased, since the valence band edge energy ($E_v$) is decreased (using the usual and customary electron energy scale in which energy decreases for electrons are equivalent to energy increases for holes). However, the energy band gap increases only very slowly above x=0.05 in $Pb_{1-x}Eu_{1-x}Se_yTe_{1-y}$, limiting the increase in $E_c$ and $E_v$ that can be obtained.

Figure 4A:
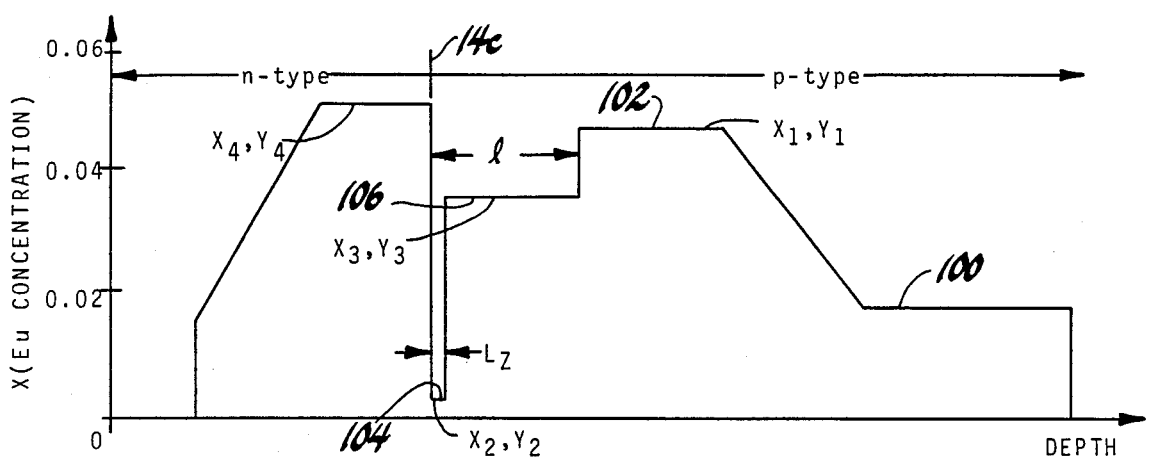
Figure 4B:
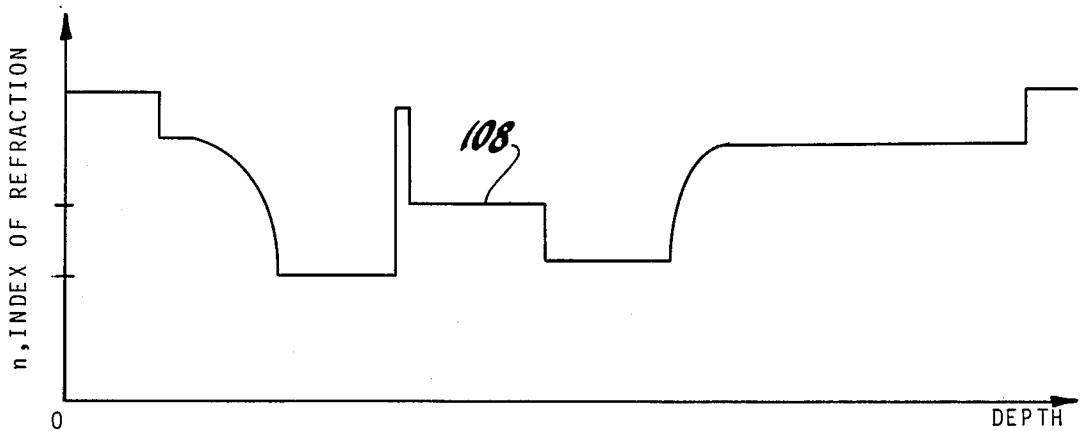
Figure 4C:
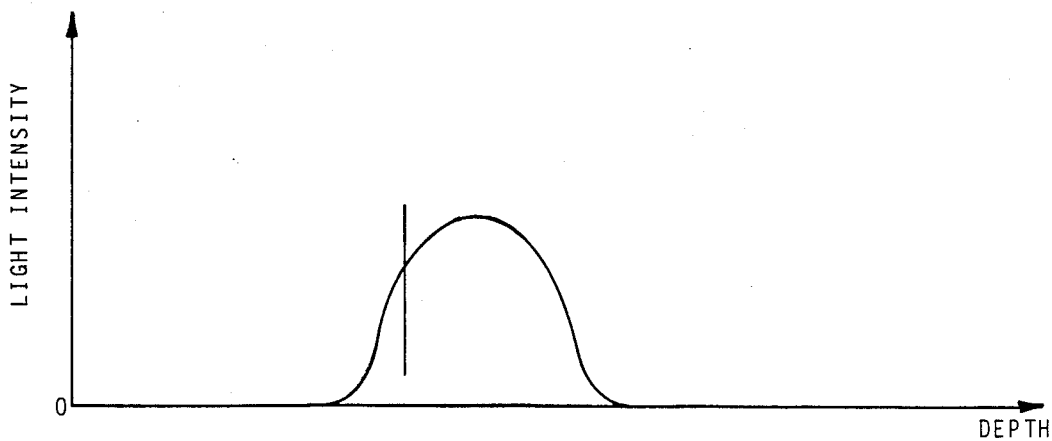

Noting that the change in band gap energy from the quantum well europium concentration 104 to the remainder 106 of the optical cavity is less than the band gap energy between the quantum well concentration 104 and concentration plateau 102, placement of the quantum well layer 16e toward the p-type side of active region 16 results in a reduced loss of electrons toward the p-type side of the laser diode structures shown in FIGS. 2A, 2B, 2C, and 3A, 3B, 3C. For the structures shown in FIGS. 2A, 2B, 2C and 3A, 3B, 3C, electrons which leak out of the quantum well on the n-type side subtract from the electron injection current into the quantum well and thus do not increase the threshold current. As shown in FIGS. 4A, 4B, 4C, placement of quantum well 16e toward the n-type side of optical cavity 16 results in a reduced loss of holes toward the n-type side of the laser diode structure. In both cases, because more charge carriers are confined in the quantum well, layer 16e, it requires less electrical current flowing through the laser diode to reach the charge carrier concentrations necessary to attain laser threshold and, accordingly, maximum operating temperature is increased.

Figure 2B:
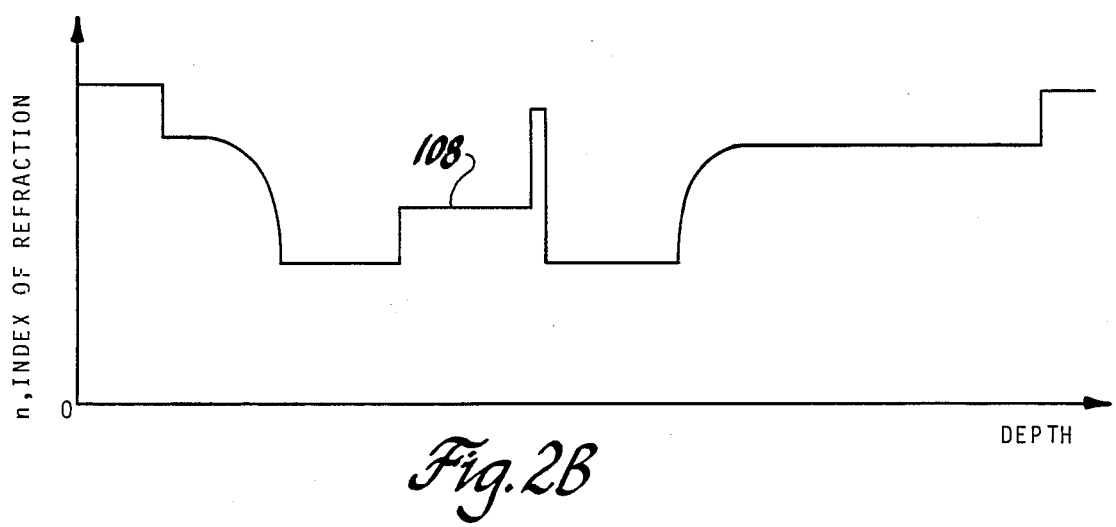
Figure 2C:
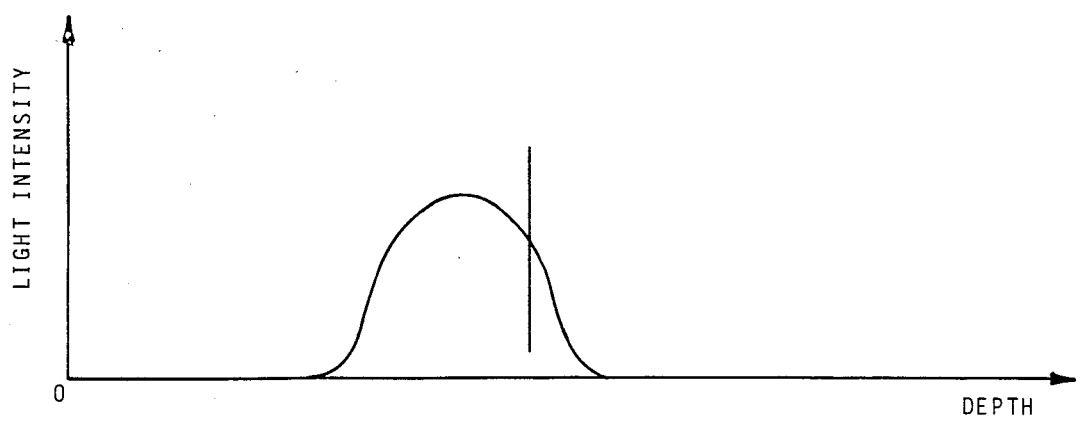

According to the structure shown in FIGS. 2A, 2B, 2C; 3A, 3B, 3C and 4A, 4B, 4C, the carrier electrons and holes can be tightly confined to approximately their deBroglie wavelengths in a PbTe quantum well. On the other hand, the photons generated by stimulated electron-hole radiative recombination cannot be confined very well to such small dimensions since the wavelength of these photons in this material is roughly 1 micrometer, which is very much greater than $L_z (\leq 0.12$ micrometers) and more nearly comparable to the thickness of the optical cavity. The wavelength of the photons in the optical cavity is $\lambda_o/n$, where $\lambda_o$ is the free space wavelength of the photons and n is the index of refraction. In these materials, n has a value in the approximate range of 5.5-6.0. The lower europium concentrations (x) in optical cavity 16 cause a higher index of refraction as shown by features 108 in FIGS. 2B, 3B and 4B. This creates a waveguide which confines the light to roughly the dimension l which is approximately the wavelength $\lambda_o/n$ of the lasing photons in the medium. Placing the PbTe quantum well at one side of optical cavity 16 avoids an increased electron leakage current from the quantum well 16e. This leakage would result from the decreased $E_c$ which exists if the quantum well 16e is placed in the center of optical cavity 16. While having $x_2$ and $y_2=0$ in the quantum well increases carrier confinement to the quantum well, allowing $x_2$ and $y_2$ to be greater than 0 enables the building of lasers which operate at shorter wavelengths than are possible with a PbTe quantum well.

In general, $x_1$, $y_1$ does not have to be the same as $x_4$, $y_4$. In all cases, the value of Se concentration, y, is chosen to lattice match to PbTe for a given value of x.

The energy, E, in millielectron volts (meV) of photons emitted from lasers with $Pb_{1-x}Eu_xSe_yTe_{1-y}$ active layers is given by $$E = A + \frac{BT^2(1-Cx)}{T+D} + Ex$$

where A=185 meV, B=0.548 meV/K$^{-2}$, C=11.0, D=30 K, E=5800 meV, T is the temperature in degrees Kelvin, x is the europium mole fraction, and y (the selenium mole fraction) is given by the condition for lattice matching $Pb_{1-x}Eu_xSe_yTe_{1-y}$ to PbTe. This condition is discussed subsequently. This formula has so far been verified for $0 \leq x < 0.046$ for double heterojunction lasers in which quantum effects are not significant. We believe that larger values of x will probably also be useful in laser active regions, but the limits have not yet been well established.

A blanket epitaxial layer 18 of the n-type $Pb_{1-x4}Eu_{x4}Se_{y4}Te_{1-y4}$ is disposed on the upper surface of the optical cavity 16. As previously mentioned, this layer is a second, or upper, europium and selenium-containing semiconductive lead chalcogenide confinement layer 18 that is similar in composition and properties to the lower lead chalcogenide semiconductive confinement and buffering layer 14, except for a difference in doping. The upper confinement layer 18 is heavily doped to n-type conductivity by containing an n-type impurity concentration of about $2 \times 10^{18}$ to $1 \times 10^{19}$ atoms per cubic centimeter. Like the lower confinement layer 14, the upper confinement layer 18 has a face centered cubic crystal lattice having a lattice constant of about 6.460 angstroms. Both confinement layers 14 and 18 have an energy band gap ($E_g$) that is higher (see FIGS. 2A, 3A, and 4A) and an index of refraction that is lower than that of the optical cavity 16. Hence, they can provide both carrier and optical confinement (see FIGS. 2C, 3C, and 4C).

The thickness of confinement layer 18 and optical cavity 16, including its portions 16a, 16b, and 16e are similar in this invention to what they would be in other semiconductor diode lasers of comparable emission wavelengths. For example, we prefer that the optical cavity 16 and the confinement layer 18 each be about 1-2 micrometers thick. As with any other heterojunction semiconductor diode lasers, confinement layer 18 should have a thickness of at least about 0.1 micrometer in order to significantly confine electrons and holes. We doubt that there is much benefit in having the confinement layer 18 be appreciably thicker than about 3 micrometers. In fact, if it is too thick, it will impede heat flow away from the pn junction 16c. Lead salt semiconductors are not particularly heat conductive. In view of this, one ordinarily wishes to have pn junction surface 16c as close to the upper surface 26 of the laser element 10 as is practical, because a heat sink (not shown) is affixed to that surface.

In addition, in order to insure that a durable, low resistance ohmic contact can be obtained on the upper surface of the device, a final upper semiconductive layer 20 is epitaxially deposited onto the confinement layer 18. The upper layer 20 is of lead telluride (PbTe). It is a semiconductive monocrystalline layer having the same face centered cubic crystal structure and lattice constant of 6.460 angstroms as the underlying layers. It is heavily doped to n-type conductivity, by having an n-type impurity concentration between about $5 \times 10^{18}$ and $2 \times 10^{19}$ atoms per cubic centimeter.

Layer 20 has a thickness of about 0.3-1 micrometers after device fabrication is completed. If this layer 20 is to be used at all, i.e., to enhance contact formation, it should have a thickness at least large enough to provide a continuous coating. On the other hand, it should not be so thick as to provide a significant thermal resistance between the pn junction surface 16c and the upper surface 26 of the laser element, where heat is ordinarily withdrawn to cool the laser. Accordingly, we would not want the layer 20 to be appreciably more than about 1 micrometer thick.

Ordinarily, a laser such as shown in the drawing is fabricated by initially blanket depositing its various layers onto a substrate and then surface etching the resultant product to define the lasing mesa, i.e. the central mesa in the drawing. We contemplate making our laser similarly. For example, after layers 14, 16, 18 and 20 are epitaxilly deposited, parallel grooves 22 and 24 are etched into the upper surfaces 26 of the wafer, preferably down through all of the layers and into the surface of the substrate 12 but at least to the depths of the pn junction (16c). The length, width and depth of the grooves, as well as their side wall angle with surface 26, are not more material to this invention than they are to any other double heterojunction semiconductor infrared diode laser. For purposes of providing a specific example, these dimensions should be wide enough apart to provide a width on upper surface 26 of the central mesa of about 5-40 micrometers, preferably 10 micrometers. The length of upper surface 26 should be about 150-600 micrometers, preferably 400 micrometers. The width of grooves 22 and 24 is not especially critical either. Then the entire upper surface 26 is anodized, including the surfaces within the grooves 22 and 24, to form a native oxide coating 28.

A rectangular contact window 30, extending substantially along the entire length of the upper surface 26 of the central mesa, is opened in anodic oxide coating 28 by photoetching techniques, so that a low resistance ohmic contact can be made along the entire upper surface 26 of the upper layer 20. The coated substrate is then cut along the side mesas 32 and 34 to provide an elongated body having a central mesa for lasing. The ends of substrate 12 are then cleaved in the normal and accepted manner, to provide a laser cavity in the central mesa. Low resistance electrical contacts can be made to n-type surface 26 exposed within window 30, and to the p-type backside (not shown) of substrate 12 in any normal and accepted manner for making contacts to PbTe. For example, they can be made in the same manner previously described in U.S. Pat. No. 4,350,990 by Wayne Lo, which is entitled "Electrode for Lead-Salt Diodes" and which is incorporated herein by reference.

Dopants used in the substrate 12 and the various layers 14, 16, 18 and 29 can be the same as those conventionally used in making any lead salt semiconductor diode laser. Normally, one would want to use a dopant that has a very low diffusion constant to ensure that the pn junction surface 16c is not only abrupt as formed but remains so during use. Accordingly, in most instances, it is preferred to dope the various layers as formed rather than subsequently by diffusion. We prefer to use bismuth as the n-type dopant: other conventional n-type dopants are arsenic, gallium, and aluminum. Beside the relatively rapidly diffusing thallium, other useful p-type dopants may be lithium, sodium, potassium, rubidium, and cesium.

In general about 1 to 15, and preferably less than 10, mole percent of europium and selenium should be included in confinement layers 14 and 18. The selenium content should roughly equal whatever europium content is used in these layers. However, the europium (and selenium) content in layer 14 does not have to be even roughly equal to the europium content in layer 18.

This invention is primarily of interest because it can be used to form a double heterojunction structure in combination with lead telluride to form the short, i.e. less than about 6 micrometers, wavelength infrared diode lasers. In the past, such laser structures had to be made using lead salt semiconductors such as lead cadmium sulfide, lead sulfide, lead sulfide selenide, lead cadmium telluride, lead manganese telluride, lead germanium telluride and the like. All of the later materials present difficulties in fabricating lattice-match double heterojunction laser. However, even more importantly it is extremely difficult to make durable low resistance ohmic contacts to such semiconductors. Accordingly, this invention is most importantly applied to short wavelength infrared diode lasers, such as lasers having a lead-europium selenide-telluride optical cavity.

The embodiments of the invention in which an exclusive property or privilege is claimed are defined as follows:

1. A double heterojunction semiconductor diode laser with an increased operating temperature, wherein the improvement comprises:

a first confinement layer of a semiconductor material having the formula $Pb_{1-x1}Eu_{x1}Se_{y1}Te_{1-y1}$;

an optical cavity having two surfaces, comprising:

(a) a quantum well layer of a semiconductor material having the formula $Pb_{1-x2}Eu_{x2}Se_{y2}Te_{1-y2}$, where $x1 > x2$, one of said two surfaces being adjacent said first confinement layer, said quantum well layer having a thickness approximately equal to the de-Broglie wavelength of charge carriers in the quantum well layer, and (b) a waveguide layer of semiconductor material having the formula $Pb_{1-x3}Eu_{x3}Se_{y3}Te_{1-y3}$ where $x2 < x3 < x1$;

a second confinement layer of a semiconductor material having the formula $Pb_{1-x4}Eu_{x4}Se_{y4}Te_{1-y4}$, where $x4 > x3$, said second confinement layer being adjacent the other of said two optical cavity surfaces; and pn junction surface defining two conductivity-type regions in said laser, the semiconductor material in one said region being doped p-type and semiconductor material in the other said region being doped n-type.

2. The double heterojunction semiconductor diode laser of claim 1, wherein x2 does not exceed 0.025.

3. The double heterojunction semicondutor diode laser of claim 1, wherein the quantum well thickness $L_z$ is in the range of 200-1200 angstroms.

4. The double heterojunction semiconductor diode laser of claim 1, wherein pn junction surface lies in or adjacent the optical cavity.

5. A large optical cavity quantum well semiconductor diode laser with an increased operating temperature wherein the improvement comprises:

a substrate;

a first confinement layer on the substrate, said first confinement layer having the formula $Pb_{1-x1}Eu_{x1}Se_{y1}Te_{1-y1}$;

an optical cavity having two surfaces, the first of said surfaces being adjacent said first confinement layer, said optical cavity comprising:

(a) a quantum well layer of a semiconductor material having the formula $Pb_{1-x2}Eu_{x2}Se_{y2}Te_{1-y2}$, said quantum well layer having a thickness approximately equal to the deBroglie wavelength charge carriers in the quantum well, and (b) a waveguide layer of semiconductor material having the formula $Pb_{1-x3}Eu_{x3}Se_{y3}Te_{1-y3}$, where $x2>x3`x1$;

a second confinement layer of semiconductor material having the formula $Pb_{1-x4}Eu_{x4}Se_{y4}Te_{1-y4}$; and a pn junction surface defining two conductivity-type regions in said laser, the semiconductor material in one said region being doped p-type and the semiconductor material in the other said region being n-type.

6. The large optical cavity quantum well semiconductor diode laser of claim 5, wherein the pn junction surface lies in or adjacent the optical cavity.

7. The large optical cavity quantum well semiconductor diode laser of claim 6, wherein said quantum well layer is adjacent said first confinement layer and said waveguide layer is adjacent said second confinement layer.

8. The large optical cavity quantum well semiconductor diode laser of claim 7, wherein the one of said two conductivity-type regions doped p-type includes the first confinement layer.

9. The large optical cavity quantum well semiconductor diode laser of claim 6, wherein said waveguide layer is adjacent said first confinement layer and said quantum well layer is adjacent said second confinement layer.

10. The large optical cavity quantum well semiconductor diode laser of claim 9, wherein the one of said two conductivity type regions which is doped p-type includes the first confinement layer.

11. The large optical cavity quantum well semiconductor diode laser of claim 5, wherein said pn junction surface lies in or adjacent the quantum well layer.

12. The large optical cavity quantum well semiconductor diode laser of claim 11, wherein said quantum well layer is adjacent said first confinement layer and said waveguide layer is adjacent said second confinement layer.

13. The large optical cavity quantum well semiconductor diode laser of claim 12, wherein the one of said two conductivity type regions which is doped p-type includes the first confinement layer.

14. The large optical cavity quantum well semiconductor diode laser of claim 13, wherein x2 is less than 0.025.

15. The large optical cavity quantum well semiconductor diode laser of claim 13, wherein the thickness $L_z$ of the quantum well layer is in the range of 200–1200 angstroms.

16. The large optical cavity quantum well semiconductor diode laser of claim 11, wherein said waveguide layer is adjacent said first confinement layer and said quantum well layer is adjacent said second confinement layer.

17. The large optical cavity quantum well semiconductor diode laser of claim 16, wherein the one of said two conductivity type regions which is doped p-type includes the first confinement layer.

18. The large optical cavity quantum well semiconductor diode laser of claim 17, wherein x2 is less than 0.025.

19. The large optical cavity quantum well semiconductor diode laser of claim 17, wherein the thickness $L_z$ of the waveguide layer is in the range of 200–1200 angstroms.

* * * * *